(12) United States Patent
Poris

(10) Patent No.: US 7,005,306 B1
(45) Date of Patent: Feb. 28, 2006

(54) ACCURATE THICKNESS MEASUREMENT OF THIN CONDUCTIVE FILM

(75) Inventor: Jaime Poris, Boulder Creek, CA (US)

(73) Assignee: Nanometrics Incorporated, Milpitas, CA (US)

( * ) Notice: Subject to any disclaimer, the term of this patent is extended or adjusted under 35 U.S.C. 154(b) by 82 days.

(21) Appl. No.: 10/618,155

(22) Filed: Jul. 11, 2003

(51) Int. Cl.
*H01L 21/66* (2006.01)

(52) U.S. Cl. .................. 438/17; 424/758; 424/719

(58) Field of Classification Search ........ 324/228–238, 324/719, 758; 438/17
See application file for complete search history.

(56) References Cited

U.S. PATENT DOCUMENTS

| | | | | |
|---|---|---|---|---|
| 4,084,136 A | * | 4/1978 | Libby et al. ............. | 324/238 |
| 4,849,694 A | | 7/1989 | Coates ................... | 324/230 |
| 5,525,903 A | | 6/1996 | Mandl et al. ............ | 324/230 |
| 5,625,170 A | | 4/1997 | Poris ..................... | 177/50 |
| 5,698,989 A | * | 12/1997 | Nulman .................. | 324/719 |
| RE37,749 E | | 6/2002 | Poris ..................... | 204/230.1 |
| 6,407,546 B1 | | 6/2002 | Le et al. ................. | 324/230 |
| 6,433,541 B1 | | 8/2002 | Lehman et al. .......... | 324/230 |
| 6,563,308 B1 | | 5/2003 | Nagano et al. .......... | 324/230 |
| 6,700,370 B1 | | 3/2004 | Chen et al. .............. | 324/230 |
| 6,790,331 B1 | * | 9/2004 | Katsumaru et al. ...... | 205/84 |
| 6,815,947 B1 | | 11/2004 | Scheiner et al. ......... | 324/230 |
| 2002/0053904 A1 | | 5/2002 | Chen et al. .............. | 324/230 |
| 2002/0070126 A1 | * | 6/2002 | Sato et al. .............. | 205/640 |
| 2003/0090266 A1 | | 5/2003 | Kesil et al. ............. | 324/230 |
| 2004/0070393 A1 | | 4/2004 | Sarfaty et al. ........... | 324/230 |

FOREIGN PATENT DOCUMENTS

RU    1613847 A    * 12/1990

OTHER PUBLICATIONS

The Penguin Dictionary of Electronics, 3rd ed, Penguin Books: London, 1998, pp. 486 and 513.*
"Eddy Current Theory—Testing", http://www.hocking.com/theory_testing.htm, downloaded Mar. 6, 2003, 9 pages.

* cited by examiner

*Primary Examiner*—Tuan H. Nguyen
(74) *Attorney, Agent, or Firm*—Silicon Valley Patent Group LLP

(57) ABSTRACT

The thickness of a thin conductive film is accurately measured without direct knowledge of the temperature of the sample. A coulometer measurement during deposition of the conductive film on a substrate, along with other data such as the plated surface area, the electrochemical reaction, the molar volume of the deposited metal and the coulombic efficiency, is used to determine the average thickness of the film. Eddy current measurements yield the sheet resistance of the film at a plurality of locations, from which the average sheet resistance can be determined. The eddy current measurements are made so as to reduce the effects of any temperature change in the sample. The average thickness and the average sheet resistance yield the average resistivity of the film. The thickness of the film at a measurement location can be calculated using that average resistivity and the sheet resistance measurement at that location.

10 Claims, 5 Drawing Sheets

ACCURATE THICKNESS MEASUREMENT OF THIN CONDUCTIVE FILM

FIELD OF THE INVENTION

The present invention relates to measuring the thickness of a film, and in particular to accurately measuring the thickness of a conductive film without an accurate knowledge of the temperature of the sample.

BACKGROUND

The manufacturing of semiconductor devices includes the deposition of metal films as well as a multitude of other materials. To optimize the production process and control the performance of the devices, properties of the metal films and other materials must be carefully monitored. Of course, it is desirable to minimize cost associated with the manufacturing process. To that end, metrology tools should be as precise and as accurate as necessary, be economical, be reliable and have an adequate throughput.

One parameter of deposited metal films that is closely monitored is the film thickness. Another parameter of interest is the sheet resistance. The measured resistance is important for analyzing the performance of the electronic devices in, e.g., an integrated circuit, while the thickness of the film is indicative of how well the device is made with respect to the entire process flow. The accurate measurement of sheet resistance and thickness of thin films is important in industries such as semiconductors and magnetic head fabrication.

A metrology tool that is sometimes used to measure conductive film thickness is an x-ray tool. Unfortunately, X-ray tools are not capable of measuring the sheet resistance. An eddy current sensor is commonly used to measure the thin film sheet resistance associated with conductive samples. While the standard eddy current sensor cannot measure the actual film thickness, the measured sheet resistance can be converted into film thickness with knowledge of the resistivity of the material. Additionally, eddy current measurements can be employed to characterize the magnetic properties of samples or detect the presence of defects or voids in conductive samples.

One factor limiting the precision and accuracy of an eddy current measurement is the change in resistance of the conductive film as a function of temperature. With a well designed system, the change in resistance as a function of temperature may be the largest source of error. Unfortunately, it is often impractical, inconvenient or time consuming to measure or control the temperature of the sample close to or simultaneously with the eddy current measurement. Attempting to control the temperature of the sample is undesirable as it requires additional hardware and unwanted expenses, complicates the robotics, and decreases throughput if the sample must achieve temperature stability. Further, in some applications, it is desirable to minimize contact with the sample (for contamination reasons) disallowing direct contact of the sample with a large thermal heat sink (a temperature controlled mass). Another option is to attempt to measure the temperature of the sample at the time of measurement. However, non-contact temperature measurement means (such as infrared sensors near room temperature) typically do not have the accuracy that is required. Further, temperature measurement methods relying on contacting the sample may be prohibited due to potential damage or contamination or they may complicate the robotics.

Thus, what is needed is an improved resistance and thickness measurement tool that reduces or eliminates errors caused by resistance changes caused by temperature.

SUMMARY

In accordance with the present invention, the thickness of a thin conductive film is accurately measured without direct knowledge of the temperature of the sample. The average thickness of the film is determined during deposition, e.g., using coulometer measurements that are made during electrochemical deposition of the conductive film on a substrate, along with other data such as the plated surface area, the electrochemical reaction, the molar volume of the deposited metal and the coulombic efficiency. The sheet resistance of the film is determined at a plurality of locations using eddy current measurements. From the plurality of sheet resistance values, an average sheet resistance value for the film can be determined. Because the plurality of eddy current measurements is made over a finite period of time, appropriate care is taken to reduce the effects on the measurements of any temperature change in the sample, e.g., by making the eddy current measurements after the sample temperature has stabilized or by measuring the temperature of the sample, precisely but not necessarily accurately, at approximately the same time as each eddy current measurement and adjusting the measured resistances to the same temperature. The average resistivity of the film can then be calculated based on the average thickness and the average sheet resistance values. The thickness of the film at any measurement location can then be calculated using the average resistivity along with the individual resistance (or conductance) measurement at that measurement location.

One embodiment of the present invention is a method that includes determining the average thickness of a film deposited over a substrate and measuring at least one of the resistance and conductance of the film at a plurality of locations. The method further includes determining the sheet resistance at each of the plurality of locations and calculating the average sheet resistance for the plurality of locations. The average resistivity is calculated using the average thickness of the film and the average sheet resistance and the thickness of at least one location is calculated using the average resistivity and the determined sheet resistance of the film at that location.

The average thickness of a film deposited over a substrate can be determined by depositing the film on the substrate and determining the mass of the film material that is deposited on the substrate, which may be done, e.g., using a coulometer measurement taken during the electrochemical deposition of the film. The density of the film is determined along with the surface area over which the film is deposited. The average thickness is calculated using at least the mass of the film material, the film density, and the surface area.

The act of measuring at least one of the resistance and conductance of the film at a plurality of locations may be performed using an eddy current sensor. Additionally, the act of measuring at least one of the resistance and conductance of the film at a plurality of locations may be controlled for temperature stability. In one embodiment, controlling for temperature stability includes after processing the substrate, waiting a predetermined time for the substrate to cool before beginning to measure at least one of the resistance and conductance of the film. Of course, if the substrate is cooler than the ambient temperature, the substrate will warm up to the ambient temperature during the waiting period. In another embodiment, controlling for temperature stability includes repeatedly measuring at least one of the resistance and conductance of the film at a first location until the difference between the last two measurements is below a threshold and then measuring at the remaining locations. In another embodiment, controlling for temperature stability includes measuring the temperature of the substrate when measuring at least one of the resistance and conductance of the film at each location and adjusting the measured resistance or conductance from each of the plurality of locations to be referenced to the same temperature.

In addition, the method may include controlling for background conductivity by measuring at least one of the resistance and conductance of the substrate at the plurality of locations prior to depositing the film on the substrate. In this embodiment, the act of determining the resistance or conductance of the film uses the measured resistance or conductance of the substrate and the measured total resistance or total conductance of the film and the substrate.

Another embodiment of the present invention includes a system for determining the thickness of a conductive film on a substrate. The system includes a coulometer coupled to an electrochemical cell that deposits a conductive film on a substrate. The coulometer provides a signal indicating the amount of charge that passes through the electrochemical cell while depositing the conductive film on the sample. The system also includes an eddy current sensor that is associated with a stage. The eddy current sensor measures at least one of the resistance and conductance of the conductive film on the substrate when the substrate is on the stage. At least one of the eddy current sensor and the stage moves relative to the other. The eddy current sensor provides a signal indicating at least one of the resistance and conductance of the conductive film. The system also includes a computer system that is coupled to the coulometer to receive the signals indicative of the amount of charge that passes through the electrochemical cell. The computer system is also coupled to the eddy current sensor to receive the signals indicative of at least one of the resistance and conductance of the conductive film. The computer system includes a computer-usable medium having computer-readable program code embodied therein for calculating the average thickness of the conductive film deposited over the substrate using the coulometer signals indicative of the amount of charge that passes through the electrochemical cell. The computer-readable program code also causes the computer system to calculate the sheet resistance of the conductive film at a plurality of locations using the eddy current sensor signals indicative of at least one of the resistance or conductance of the conductive film for the plurality of locations and calculate the average sheet resistance for the plurality of locations. The computer-readable program code also causes the computer system to calculate the average resistivity using the calculated average thickness and the calculated average sheet resistance and calculate the thickness of at least one location of the plurality of locations using the average resistivity and the calculated sheet resistance at the location.

In one embodiment, the system includes a temperature sensor that measures the temperature of the substrate at approximately the same time that the eddy current sensor measures at least one of the resistance or conductance of the conductive film at each of the plurality of locations. The temperature sensor produces a signal indicative of the temperature of the substrate. The computer system is coupled to the temperature sensor to receive the signals indicative of the temperature of the substrate. The computer-readable program code also causes the computer system to adjust the measured resistance or conductance from each of the plurality of locations based on the temperature of the substrate at approximately the same time that the eddy current sensor measured the resistance or conductance.

DETAILED DESCRIPTION

In accordance with an embodiment of the present invention, an accurate sheet resistance measurement and relatively temperature independent thickness measurement of a conductive thin film are made using a system that includes an eddy current sensor and a coulometer.

Figure 1:
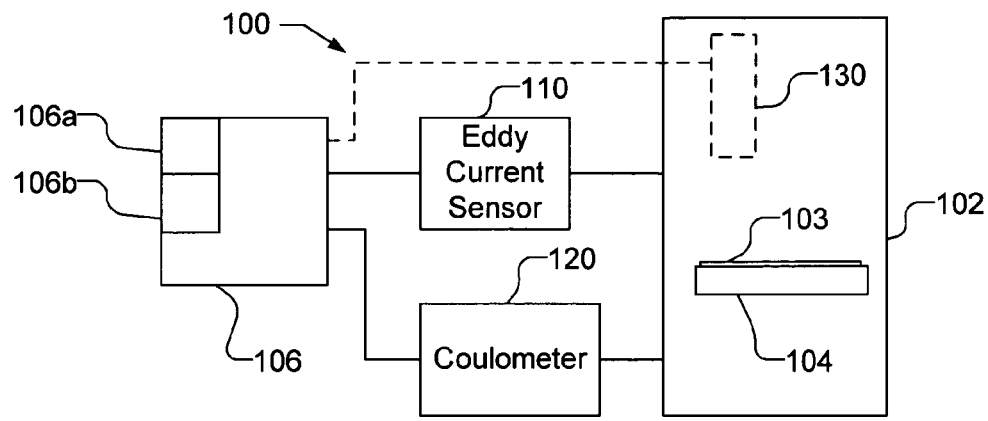
FIG. 1 is a block diagram illustrating a film thickness measuring system that includes an eddy current sensor and a coulometer.

FIG. 1 is a block diagram illustrating a system 100 that includes an eddy current sensor 110 and a coulometer 120 that are used to measure the sheet resistance and average thickness of a thin film 103 on a substrate 104 at a processing stage 102. As illustrated in FIG. 1, the eddy current sensor 110 and coulometer 120 are coupled to a computer system 106 that analyzes the data provided by eddy current sensor 110 and coulometer 120. Computer system 106 is e.g., a computer with memory 106a and a computer-usable medium 106b having computer-readable program code embodied therein for causing the computer to determine the desired measurements, i.e., resistance and thickness, as will be described herein. One of ordinary skill in the art can program code capable of determining the sheet resistance and thickness of a conductive thin film in accordance with the present invention in view of the present disclosure.

Figure 2:
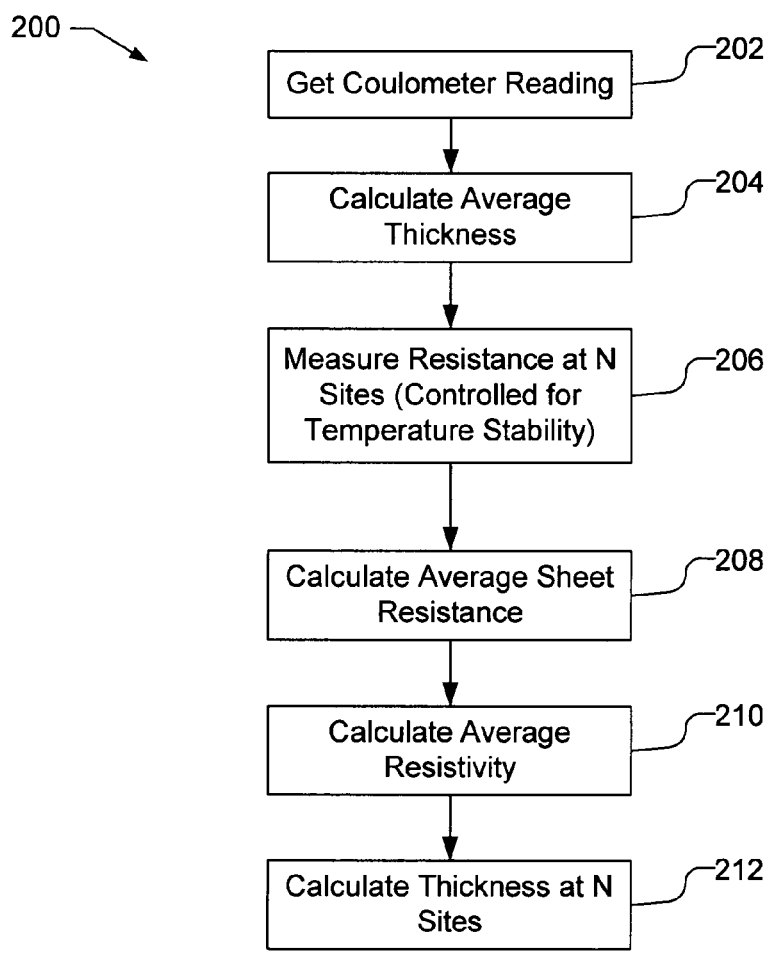
FIG. 2 is a flow chart illustrating the process of measuring the sheet resistance and thickness of a conductive thin film on substrate, in accordance with an embodiment of the present invention.

FIG. 2 is a flow chart 200 illustrating the process of measuring the sheet resistance and thickness of a conductive thin film on substrate 104, in accordance with an embodiment of the present invention. As illustrated in FIG. 2, a coulometer measurement is taken in-situ during the deposition of conductive thin film (step 202). The average thickness of the thin film can then be calculated based on the coulometer measurements (step 204). The average thickness can also be calculated using, e.g., a differential balance procedure, where the deposition of the film was not performed using an electrochemical process. A differential balance procedure measures the mass of the sample before and after deposition, and is described, e.g., in U.S. Pat. No. 5,625,170, which is incorporated herein by reference.

Figure 3:
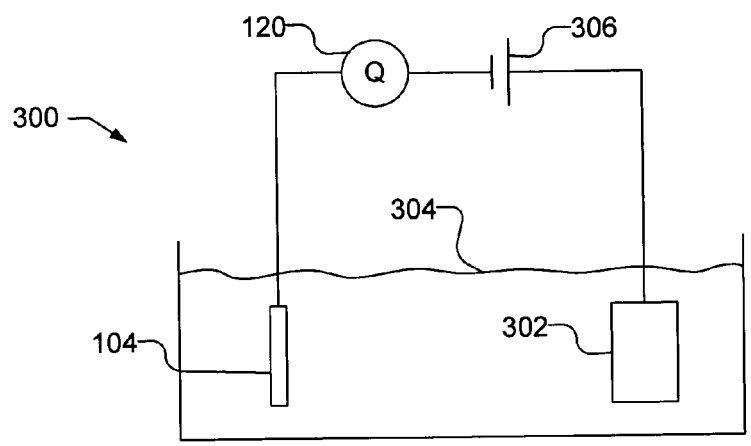
FIG. 3 schematically illustrates an electrochemical cell that is used to deposit a thin film of conductive material on substrate.

A coulometer measures the amount of charge (Q) that passes through an electrochemical cell during a plating process, from which the total amount of material deposited on a sample can be determined. By way of example, FIG. 3 schematically illustrates an electrochemical cell 300 that is used to deposit a thin film of conductive material on substrate 104. As illustrated in FIG. 3, the electrochemical cell 300 includes an anode 302, which e.g., is copper, and a cathode, which is the substrate 104 and an electrolyte solution 304. A simple or complex voltage or current signal is placed across the anode and cathode by voltage or current source 306 while the coulometer 120 measures the charge passing through the electrochemical cell.

Some aqueous electrolyte electrochemical deposition reactions yield two products at the cathode, metal and hydrogen gas. In a sulfuric acid based copper plating process, which is typically used in the semiconductor industry, very little hydrogen gas is produced. Consequently, the coulombic efficiency is close to 100% for a sulfuric acid copper deposition process, i.e., nearly all of the current is used to plate copper on the cathode and little current is used in the formation of hydrogen gas. The following describes the predominant reaction at the cathode.

$$Cu^{+2} + 2e^- = Cu^0 \qquad \text{eq. 1}$$

If copper is employed as the anode (this is typical and has advantages over an inert anode), copper is dissolved to form copper ions.

$$Cu^0 = Cu^{+2} + 2e^- \qquad \text{eq. 2}$$

If the half cell reactions of equations 1 and 2 are added, there is no net change, thus, copper dissolves from the anode and plates on the cathode.

$$Cu^0 = Cu^0 \qquad \text{eq. 3}$$

It is understood that there are numerous other reactions that occur during the plating process. These other reactions involve the relatively small quantity of additives in the electrolyte to improve the properties of the deposited copper and the dissolution of copper at the anode. For a sulfuric acid copper plating process, the number of electrons (n) required for the half cell reaction is two. A simple or complex waveform can be applied to the electrodes to optimize the properties of the deposited film, i.e., constant voltage, constant current, pulse plating, reverse pulse plating, etc. . . . Other variables include the magnitude of the current or voltage as well as the quantity and composition of the other components added to the electrolyte. A multitude of geometric factors associated with the electrochemical cell also significantly affect the properties of the plated material.

Despite the possible variables, the coulometer 120 will operate properly because it measures the charge flowing in either direction. Further, the actual coulombic efficiency ($\eta$) associated with any particular application and the associated variables can be determined empirically to minimize the error associated with the calculation of the amount of deposited material.

To determine the average thickness of the thin film (204 in FIG. 2), the mass of the deposited material is calculated from the coulometer measurement as follows.

$$\text{mass} = \frac{Q(\text{coulombs}) * \eta * \text{atomic weight (g/mole)}}{\text{Faraday's Constant (coulombs/mole)} * n} \qquad \text{eq. 4}$$

The molar volume or film density must also be known to determine the average thickness of the film from the calculated mass. For thin, electrodeposited copper films, the density is close to the bulk density of copper and is well understood.

If desired, the actual copper density of the thin film produced during the deposition process may be empirically measured, e.g., using an alternative metrology technique, such as x-ray diffraction or SEM cross sectional analysis, in order to minimize this error source. By way of example, the density of the film may be measured on test wafers at a desired frequency that ensures the density remains at a known value.

Additionally, the area of the plated surface of the sample is also required. The area of the plated surface of the sample is predominantly dictated by the geometry of the gasket on the plating tool. For example, a circular area with a diameter of 294 mm may be plated on a semiconductor wafer with a diameter of 300 mm. As is well known, the gasket excludes electrolyte from contacting the edge of the wafer and the wires that are used to make ohmic contact with the sample. Electroplating in the presence of a gasket is described in more detail in U.S. Reissue RE 37,749 which is incorporated herein by reference.

The actual plated surface area is greater than the nominal area defined by the gasket due to recesses on the surface of the substrate. Trenches and vias are depressions etched into the surface of the substrate that allow the plated metal to extend below the nominal surface of the wafer allowing this metal layer to make ohmic contact with an underlying layer. Thus, the thickness of the thin film is not uniform over the entire surface. Specific regions can have significantly more material due to properties associated with the deposition process. For example, areas with a high density of trenches can have significantly thicker copper than trench free areas. The increase in the plated surface area affects the calculated average thickness value.

In general, if a large probe spot size is used, e.g., 4 mm, an average is measured of an area that contains flat areas as well as trenches and vias. The same specific location within each die is measured, using the notch on the wafer as a reference. The specific location to be measured within each die is determined before the plating step, when the patterns can be identified with a camera. Thus, the coordinates of the specific location within each die may be determined using a standalone tool with a pattern recognition system and using those coordinates on the eddy current tool. Alternatively, if the probe spot is large enough, it may average over all types of areas on the wafer and the average value will be insensitive to the location within the die.

Using the calculated mass, film density (d) and actual plated surface area (A), the average thickness (X) of the thin film 103 can be calculated as follows (step 204 in FIG. 2):

$$X_{AVE}(\text{cm}) = \frac{\text{mass}(g)}{A(\text{cm}^2) * d(\text{g/cm}^3)} \qquad \text{eq. 5}$$

While the average thickness of the thin film has several sources of error, such as coulombic efficiency, metal density and plated area, the average thickness is still useful for the present invention.

Moreover, by calibrating the average thickness calculation, the accuracy of the average thickness can be improved. The average thickness value may be calibrated by comparing the calculated average thickness from equation 5, to an average thickness measured using another metrology technique, e.g., measuring the thickness at a plurality of locations on the substrate and calculating an average thickness. The calibration procedure will compensate for the different error sources, such as not knowing the actual surface area due to the presence of trenches and vias, the coulombic efficiency and the metal density. In one embodiment, the calibration method of measuring average thickness has a precision and accuracy of at least three times that of the average thickness method described above. Three exemplary calibration methods that can be used to determine average metal film thickness are atomic force microscopy, high resolution profilometry and x-ray diffraction. Of course, the first two calibration methods require removal of some material, e.g., through etching, to expose a step on the surface.

The coulometer measurement provides the average thickness of the film layer. Even with an accurate and precise knowledge of the average thickness, it is desirable to know the thickness uniformity across the wafer or the thicknesses at particular locations. Processing subsequent to electrodeposition is strongly affected by thickness uniformity. For example, a copper polishing process, such as chemical mechanical polishing (CMP) is executed to remove the majority of the plated copper leaving a planarized surface with exposed copper and dielectric. A non-uniform copper deposition process will degrade the planarity of the wafer following CMP as well as create additional processing complexities such as excessive erosion, excessive dishing or residuals.

Accordingly, in accordance with an embodiment of the present invention, a thickness of a particular location or a thickness map of the thin film may be generated using the process indicated in FIG. 2. As shown in FIG. 2, the resistance of the film 103 is measured at a plurality of sites on the substrate 104 (step 206). The average sheet resistance and resistivity are then calculated (steps 208 and 210, respectively). The thickness of one or more of the locations can then be calculated using the average resistivity and the measured sheet resistance at that one or more locations (step 212).

Figure 4:
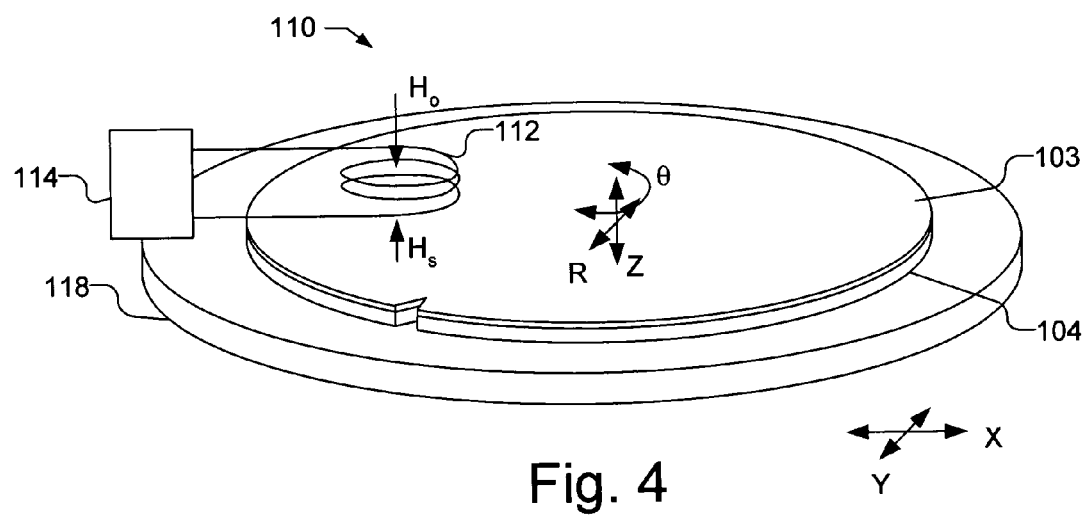
FIG. 4 illustrates an eddy current sensor adjacent to a conductive thin film on substrate that is on a stage.

As indicated in FIG. 2, the resistance of the film 103 is measured at a plurality of sites on the substrate 104 (step 206). The resistance measurement may be performed using an eddy current sensor. FIG. 4 illustrates an eddy current sensor 110 adjacent to a conductive thin film 103 on substrate 104 that is on a stage 118. The stage 118, sensor 110 or both may be moved in the X-Y directions or R-θ directions, as indicated in FIG. 4. The eddy current measurement technique involves passing an alternating current through a coil 112 which induces eddy currents in the sample, i.e., adjacent conductive thin film 103. The closed loop induced currents run perpendicular to the magnetic flux of the exciting coil 112 (typically the current runs parallel to the coil windings). The magnetic field $H_s$ of the sample opposes the applied magnetic field $H_o$. The conductive thin film 103 modifies the response of the electrical circuit 114 from which the resistance or conductance of the thin film 103 can be determined. A single coil 112 can be used for both inducing the eddy currents and sensing a change in the electrical response. Alternatively, two coils can be used; one for inducing eddy currents and one for sensing the change in electrical response. In general, eddy current measurements are well known in the art.

The sample 104 can be analyzed in terms of conductance instead of resistance, which are inversely related. The output data produced by an eddy current sensor is commonly in the form of conductance. The present disclosure sometimes discusses the output of eddy current sensor 110 as resistance, for ease of reference, but it should be understood that conductance may be used interchangeably with resistance (with appropriate conversion).

In some applications, the substrate upon which the conductive thin film is deposited already has an appreciable conductivity, which is generally referred to as "background" conductivity. If the background conductivity is ignored during the measurement of the conductive thin film, the eddy current measurement will incur a significant error. Thus, it is desirable to eliminate the background conductivity of the substrate during an eddy current measurement.

One method of minimizing the error associated with the background conductivity includes making multiple measurements at different coil excitation frequencies. Some eddy current sensors are capable of applying the multiple frequencies at the same time instead of in a serial manner.

The excitation frequency associated with an eddy current measurement affects the depth of penetration of the eddy currents into the sample (the skin effect). The higher the frequency, the less the eddy currents penetrate the sample. By way of example, the approximate skin depth formula (δ in microns) for copper is as follows:

$$\delta(\text{microns}) = \frac{66{,}000}{\sqrt{f}} \qquad \text{eq. 6}$$

By measuring the resistance or conductance of the substrate plus the thin film at different frequencies (skin depths), the resistance or conductance contribution from just the thin film can be mathematically extracted. The excitation frequencies must be chosen so that the skin depths are optimized for the approximate thickness of the thin film and the depth of the conductive components of the substrate. For example, a frequency of 10 MHz is used for a skin depth of approximately 21 microns for copper.

Other methods of minimizing the error associated with the background conductivity, in accordance with an embodiment of the present invention, are discussed below in reference to FIG. 8.

To make an eddy current measurement of thin film 103 at a plurality of locations on sample 104, the eddy current sensor 110 is placed at a fixed, known distance above the sample 104 while the eddy currents are excited in the conductive sample at a chosen frequency. The measurement area of the sample 104 is roughly comparable to the diameter of the exciting coil 112 in the eddy current sensor 110. A variation in the distance from the eddy current sensor 110 to the surface of the sample 104 from one measurement location to the next can significantly affect the magnitude and phase of the response signal of the eddy current sensor 110 degrading the accuracy and precision of the measurement. Thus, the eddy current sensor 110 should be placed a fixed distance above the sample 104 at each measurement location. For more information regarding placing an eddy current sensor a fixed distance above the surface of a sample, see U.S. Pat. No. 4,849,694 and U.S. Ser. No. 10/402,661, entitled "Eddy Current Sensor with Concentric Confocal Distance Sensor", filed Mar. 28, 2003 and assigned to the same assignee as the present disclosure, both of which are incorporated herein by reference.

The size of the area measured by the eddy current sensor 110 is proportional to the diameter of the exciting coil 112 and is, e.g., approximately 4 mm in diameter. The eddy current sensor 110 provides an average over the entire sensing area. Thus, the relatively large area of measurement of an eddy current sensor 110 (compared to other metrology devices, such as an ellipsometer) advantageously reduces the effect of a small placement error of the sensor. Care must be taken, however, when measuring near the edge of a substrate or adjacent an area with no metal. The eddy current sensor's signal will reflect the lack of metal. Thus, the larger the measurement spot size of the eddy current sensor, the further from the edge the measurement position must be. Of course, measurements can be made closer to the edge and adjusted by a compensation factor to account for the large effective spot size if desired.

The measurement area of the eddy current sensor 110 may be reduced by decreasing the diameter of the exciting coil 112 and by placing the sensor 110 closer to the surface of the sample 104 (along the Z direction in FIG. 4). In general, a compromise in the measurement area of the eddy current sensor 110 must be made with respect to the above described advantages and disadvantages. For example, when monitoring a copper film on a semiconductor wafer, the eddy current sensing area covers both regions of high trench density (thicker metal regions) and trench free areas (normal thickness regions). The measured resistance reflects the average thickness of metal in the sensed area. The location of the eddy current sensing area will result in different calculated thickness values and must be considered when analyzing the metrology results. The ability to precisely locate a measurement location can provide more useful metrology results. Thus, it is advantageous to be able to precisely locate areas on the substrate. When the substrate is covered with an opaque film, precise location of areas on the substrate is complicated because the use of pattern recognition is difficult or impossible. Accordingly, a stage with a high precision pre-alignment capability (ability to precisely orient the substrate with respect to the notch of the substrate) may be used to accurately locate desired measurement positions on the substrate.

Because the average sheet resistance is to be determined in step 208 of FIG. 2, it is desirable to make a large number of resistance measurements to provide a better average resistance value. By way of example, the eddy current sensor 110 may measure the resistance at forty nine sites on the substrate 104. Thus, after each measurement, the substrate 104 and/or the eddy current sensor 110 may be moved along the X and Y directions (as indicated in FIG. 4) by stage 118 to position the eddy current sensor 110 with respect to the substrate 104. Of course, if a polar coordinate stage is used, the substrate 104 and/or eddy current sensor may be moved in one or both of the R and θ directions (as indicated in FIG. 4).

Preferably, each of the measurement locations on the substrate 104 should have the same area density of trenches and vias. For example, measurement locations may be chosen with the same position within different die on the substrate 104. Where each measurement location has the same area density of trenches and vias, changes in resistance from one measurement location to the next will be due to changes in the thickness of the film 103 and not differences in plated surface area.

The eddy current sensor measurement is sensitive to changes in temperature. By way of example, for copper, the temperature coefficient of resistance (α) is approximately a 0.4% increase in resistance with a 1° C. change in sample temperature. Thus, a few degrees of variation can create an error larger than the acceptable total error range. For example, it is desirable to maintain an accuracy of +/−0.5% for the eddy current measurement. Thus, a 1° C. change in sample temperature would result in a 0.4% change in resistance, which is a large fraction of the total acceptable error range of 1%. In general, it is desirable to keep the temperature related error to a fraction of the accuracy range, for example +/−0.25%, which for copper is equivalent to a temperature change of approximately 1.2° C.

Accordingly, the each of the plurality of resistance measurements in step 206 should be made while controlling for temperature stability. The resistance (or conductance) measurements from the plurality of locations on the substrate 104 will be averaged, and thus, any change in temperature between the first and last eddy current measurement will cause some error in the average resistance value. One method of ensuring the temperature of the sample does not change is to control the sample temperature, e.g., using a heat sink.

Figure 5:
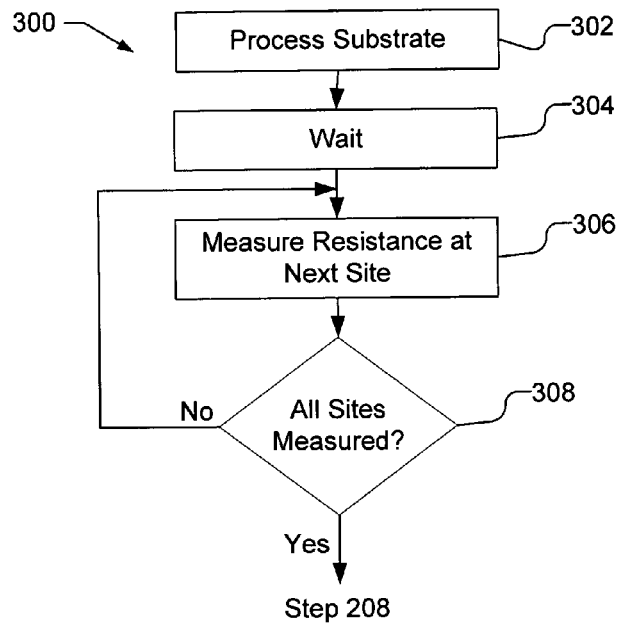
FIG. 5 is a flow chart illustrating measuring the resistance of the thin film at a plurality of sites on the substrate at a constant temperature.

Another method of reducing the temperature error from the resistance measurements is described in FIG. 5. FIG. 5 is a flow chart 300 illustrating measuring the resistance of the thin film at a plurality of sites on the substrate at a constant temperature. After the substrate is processed (step 302), e.g., the thin film is deposited and the substrate is cleaned, heated to dry and optionally annealed, the resistance measurement is made (step 306) after waiting a predetermined time for the substrate to cool (step 308). For example, after cleaning, the substrate may be to 30° C., but after waiting 15 seconds, the temperature of the substrate may drop to 25° C. The first measurement is made after 15 seconds. The remainder of the sites are then measured (step 308). The change in temperature of the substrate after the predetermined waiting period should be small so that any effects from the temperature error are insignificant. The process then flows to step 208 in FIG. 2.

It should be understood, that the cooling period need not be sufficient to allow the substrate temperature to come into equilibrium with the ambient temperature. The substrate may undergo a moderate amount of additional temperature change between the first and last resistance measurement, e.g., the first measurement is made when the substrate is at 25° C. and the substrate cools to 24.5° C. by the last measurement. A moderate amount of additional temperature change, e.g., a 0.5° C. change, can be addressed by modifying the measured resistances by a factor to compensate for the change based on the temperature coefficient of resistance of the plated film.

Figure 6:
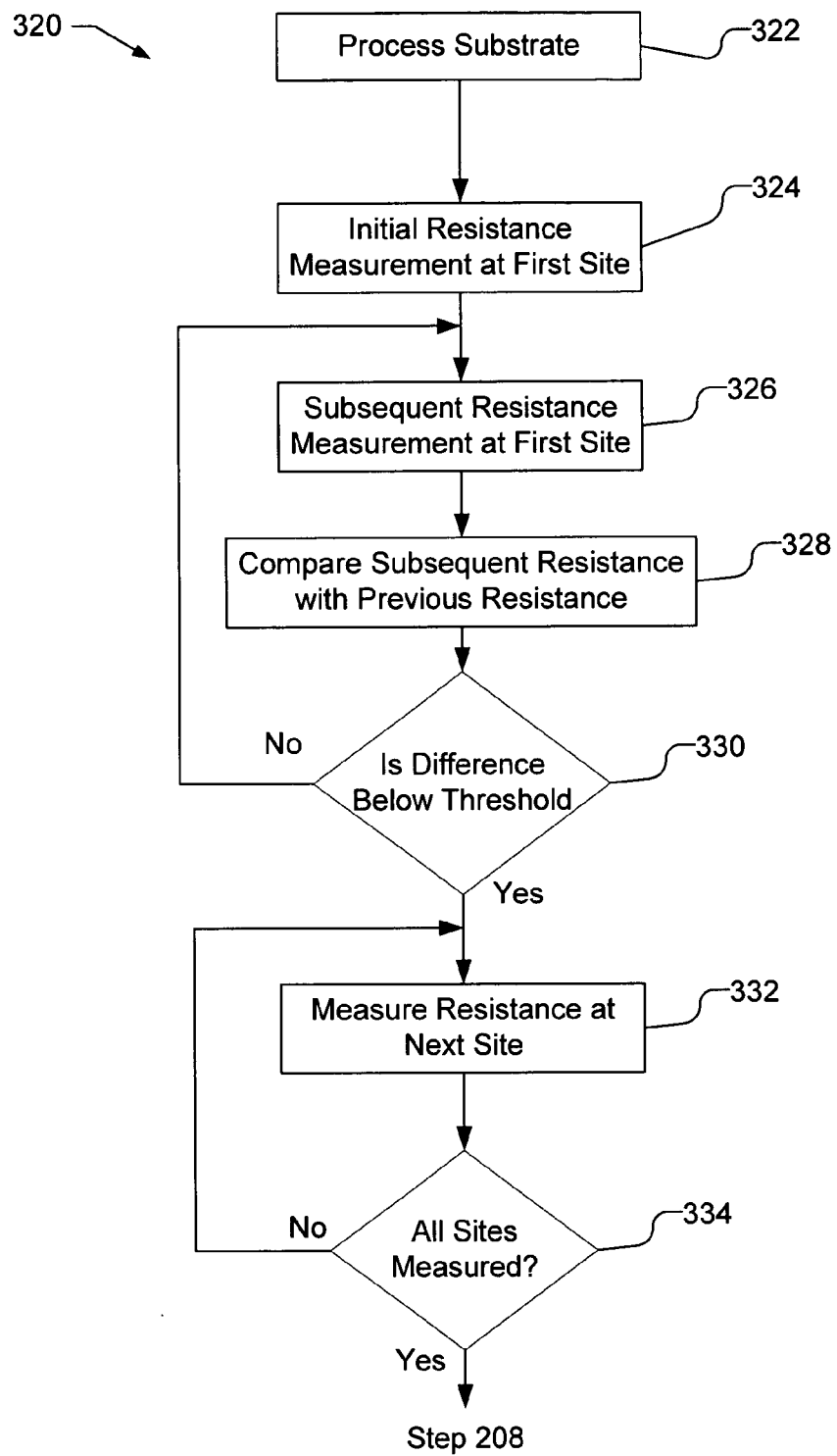
FIG. 6 is a flow chart illustrating another embodiment of measuring the resistance of the thin film at a plurality of sites on the substrate at a constant temperature.

FIG. 6 is a flow chart 320 illustrating another embodiment of measuring the resistance of the thin film at a plurality of sites on the substrate at a constant temperature. As shown in FIG. 6, the substrate is processed (step 322) followed by making an initial resistance measurement at the first measurement location (step 324). A subsequent resistance measurement is made at the same location (step 326) and the two resistance measurements are then compared (step 328). Assuming the substrate is hotter than the ambient temperature, i.e., the sample temperature is dropping, there will be a change between the two resistance measurements. If the difference in resistance is above a threshold (step 330), another resistance measurement is made at the same location. The latest resistance measurement is then compared with the previous measurement (step 328). When the difference between the last two resistance measurements is below a desired threshold (step 330), i.e., the substrate has cooled sufficiently, the process continues to measure the resistance at the remaining measurement locations (steps 332 and 334) before moving on to step 208 in FIG. 2.

Figure 7:
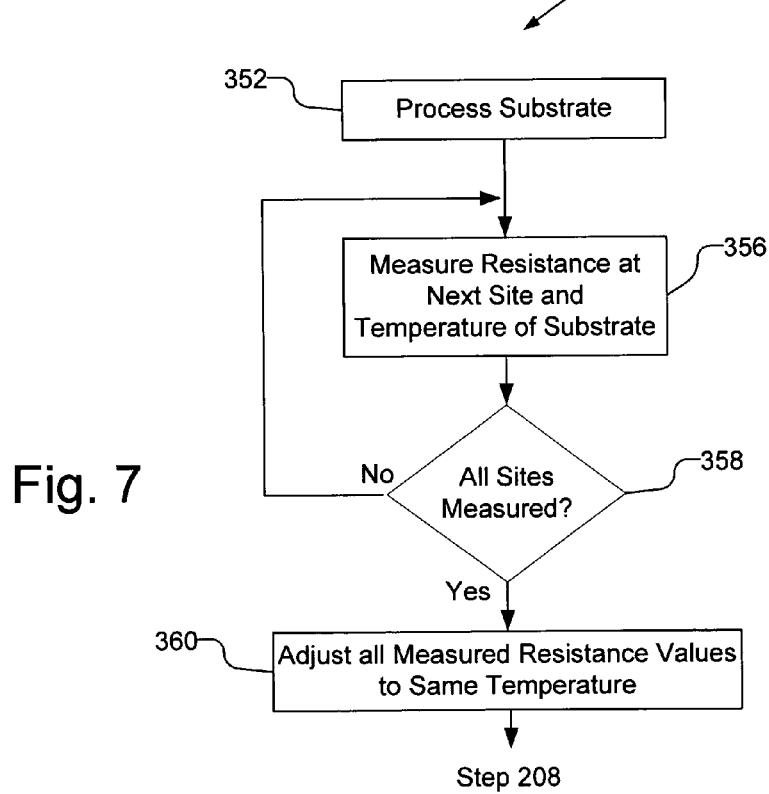
FIG. 7 is a flow chart illustrating another embodiment of measuring the resistance of the thin film at a plurality of sites on the substrate.

FIG. 7 is a flow chart 350 illustrating another embodiment of measuring the resistance of the thin film at a plurality of sites on the substrate. The process described in FIG. 7, does not rely on the substrate having a constant temperature, but instead compensates for changes in the temperature during the measurements by adjusting all the measured resistances to the same reference temperature. For example, all the resistance values can be modified to reflect the resistance at a specific temperature, e.g., 20° C.

As shown in FIG. 7, after the substrate is processed (step 352), the resistance measurements are made at all the sites (steps 356 and 358). The temperature of the substrate is measured at approximately the same time and location that the resistance measurements are made. By way of example, a non-contact temperature sensor 130 may be used, as indicated with broken lines in FIG. 1. The temperature sensor 130 is coupled to the computer system 106. The temperature measurements of the substrate should be precise, but need not be accurate, i.e., the measured temperature may differ from the true temperature of the substrate by a consistent amount. The temperature measurements are then used to adjust the resistance measurements at each location so that the resistance measurements are all referenced to the same temperature. Conversion of a resistance measurement ($R_T$) made at a Celsius temperature T can be converted to the resistance ($R_{20}$) at a desired temperature, e.g., 20° C. according to the following.

$$R_{20} = \frac{R_T}{1 + \alpha(T - 20)} \qquad \text{eq. 7}$$

where $\alpha$ is the temperature coefficient of resistance for the material being measured.

Once the plurality of resistance measurement values are adjusted to be referenced to the same temperature, the process flows to step 208 in FIG. 2.

Referring back to FIG. 2, the resistance (or conductance) measurements from the plurality of locations on the substrate 104 and the calculated average thickness are then used to yield the average sheet resistance of the substrate 104 (step 208 of FIG. 2). For thin film applications, the resistance determined from the eddy current sensor measurement may be converted to a sheet resistance (R) by multiplying the resistance by a constant. The constant is determined for a given eddy current sensor configuration including parameters such as the coil size, the distance from the sensor to the sample and the geometry of conductive components in the system. As is well known in the art, the sheet resistance is the resistance associated with a square area of a thin film. This is a property associated with the material and is influenced by parameters such as the film purity, the crystallographic orientation of the grains, the thin film thickness and the surface roughness.

The average thickness from step 204 and the average sheet resistance from step 208 are then used to determine the average resistivity ($\rho_{AVE}$) of the film 103 (step 210). The resistivity is a property of the film material and is also a function of temperature. Thus, the average resistivity ($\rho_{AVE}$) will be valid only for this specific wafer measurement sequence and is not necessarily an accurate value for the temperature assumed. The sheet resistance R is related to the thickness X and the resistivity $\rho$ for a thin film as follows:

$$R(\text{ohm/square}) = \frac{\rho(\text{ohm} - \text{cm})}{X(\text{cm})}. \qquad \text{eq. 8}$$

It is assumed that the resistivity at a constant temperature is constant for all locations on the substrate. Therefore, the average resistivity in step 210 can be determined as follows:

$$\rho_{AVE} = R_{AVE} * X_{AVE}. \qquad \text{eq. 9}$$

The actual thicknesses X at each measured location (i) can then be determined using the average resistivity $\rho_{AVE}$ and the sheet resistance R measured at that location (step 212) as follows:

$$X_i = \frac{\rho_{AVE}}{R_i}. \qquad \text{eq. 10}$$

By determining the actual thickness at a plurality of locations, a thickness map of the film can be produced.

The thickness values calculated for the measurement locations in step 212 significantly reduce temperature errors by using an average resistivity $\rho_{AVE}$, which is valid for the adjusted temperatures of the actual resistance measurements. It is assumed that the resistivity at a constant temperature is constant for all locations on the substrate. Accordingly, the present invention is capable of producing accurate and precise thickness values at a plurality of locations even if the sample is at an unknown temperature or is at a temperature value with an inadequate degree of accuracy. The temperature corrected sheet resistance values at a plurality of locations are proportionally correct but not necessarily accurate. If the sheet resistance values are converted to percentage change sheet resistance (the sheet resistance value is multiplied by 100 and divided by the average sheet resistance), these values are accurate.

As discussed above, some substrates 104 will have a significant amount of conductivity under the thin film 103. One method of minimizing the error associated with the background conductivity includes making multiple measurements at different coil excitation frequencies as discussed above. Another method of minimizing the background conductivity error is to measure the conductivity prior to deposition of the thin film 103.

Figure 8:
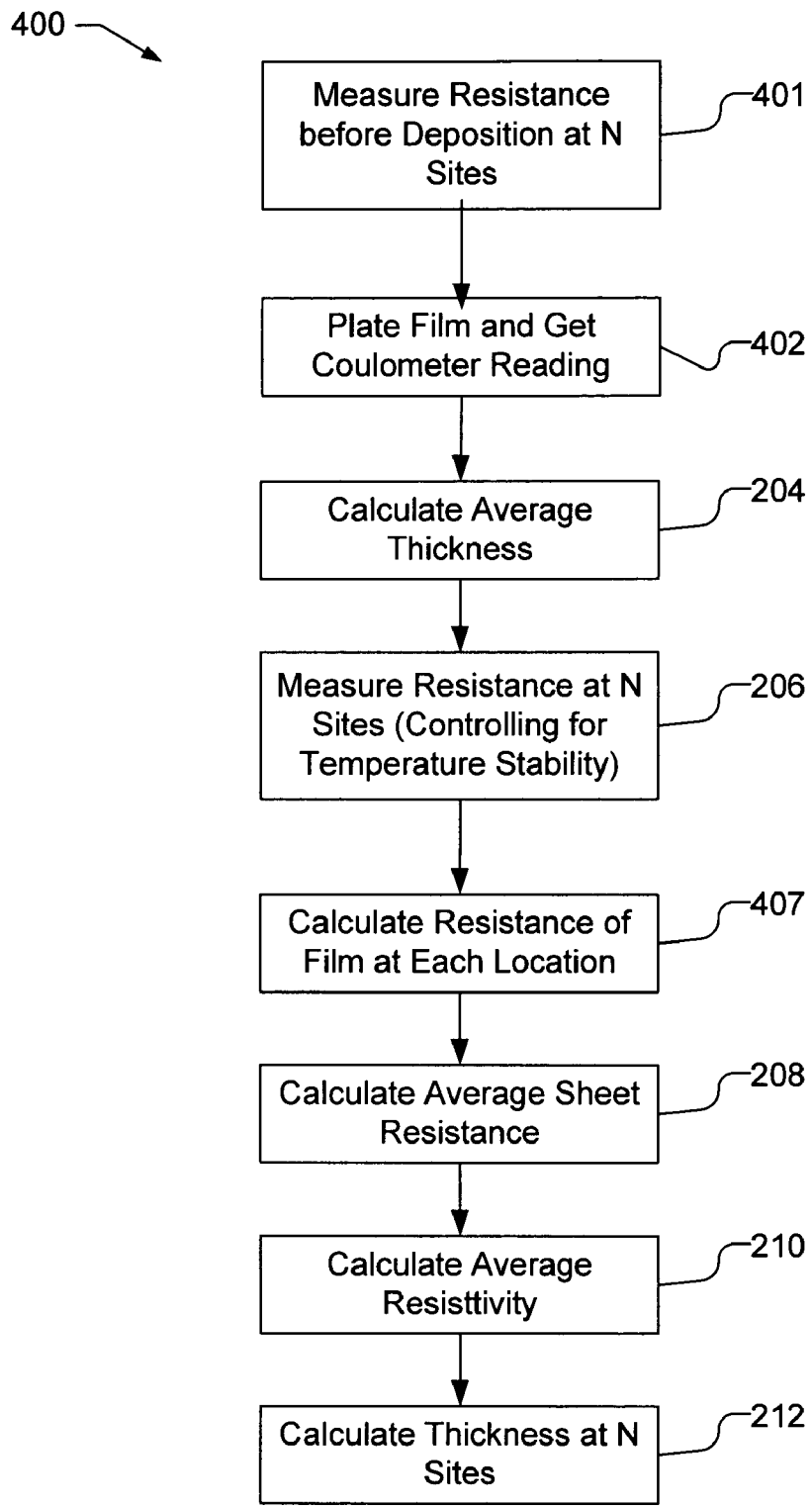
FIG. 8 is a flow chart illustrating the process of measuring the sheet resistance and thickness of a conductive thin film on substrate, in accordance with another embodiment of the present invention.

FIG. 8 is a flow chart 400 illustrating the process of measuring the sheet resistance and thickness of a conductive thin film 103 on substrate 104, in accordance with another embodiment of the present invention. FIG. 8 is similar to FIG. 2, with like designated elements being the same. As shown in FIG. 8, the resistance of the substrate is measured at a plurality of locations prior to deposition of the thin film (step 401). The locations that are measured in step 401 prior to deposition of the film (step 402) should be the same locations measured in step 206 after deposition of the film.

The measurement of the resistance prior to deposition of the film may be performed using eddy current sensor 110, as described in reference to step 206 above. In general, however, it is not necessary to control for a change in temperature in the substrate during the pre-deposition resistance measurement. Typically, the resistance of the substrate will be significantly larger than the resistance of the deposited film. For example, if the resistance of the substrate is 10 times larger than the deposited film, a 9% error in resistance will result by ignoring the substrate and, consequently, the film will be determined to be 9% thicker than it is. However, a pre-deposition measurement of resistance of the substrate that is not compensated for temperature errors will not significantly degrade the accuracy and precision of the final thickness measurements. For example, if the resistance of the substrate is 10 times larger than the resistance of the deposited film, a 1% error in resistance due to temperature variations will only result in approximately a 0.1% error in the determination of the film resistance. Thus, controlling the pre-deposition resistance measurements for temperature is not critical. Of course, if desired, the pre-deposition resistance measurements can be controlled for temperature as described above.

After the pre-deposition resistance measurements, the film is deposited while performing the coulometer measurement (step 402), as described above. The average thickness of the deposited film can then be determined (step 204).

The resistance at the plurality of locations is then measured in step 206 as described above. However, because the background conductivity error is being controlled with a pre-deposition measurement, the use of multiple measurements at different coil excitation frequencies is not necessary.

Using the pre-deposition resistance measurements from step 401 and the post-deposition resistance measurements, the thin film resistance can be calculated with the background conductivity error minimized (step 407). The thin film resistance ($R_f$) can be calculated as follows:

$$R_f = \frac{1}{\frac{1}{R_t} - \frac{1}{R_s}} \qquad \text{eq. 12}$$

where the pre-deposition resistance, which is associated with the substrate, is $R_s$; and the post-deposition resistance, which is associated with the total resistance of the substrate and the thin film, is $R_t$.

It should be understood that where conductance is used rather than resistance, equation 12 converts to the following:

$$C_f = C_t - C_s \qquad \text{eq. 13}$$

where $C_s$ is the conductance associated with the substrate prior to depositing the thin film, $C_t$ is the total conductance with the thin film and the substrate, and $C_f$ is the conductance associated with the thin film.

Once the resistance of the film at each measurement location is determined, the processes continues as described above, i.e., calculating the average sheet resistance (step 208), the average resistivity (step 210), and the actual thickness at each location (step 212).

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method comprising:
   determining the average thickness of a film deposited over a substrate;
   measuring at least one of the resistance and conductance of the film at a plurality of locations;
   determining the sheet resistance at each of the plurality of locations;
   calculating the average sheet resistance for the plurality of locations;
   calculating the average resistivity using the average thickness of the film and the average sheet resistance; and
   determining the thickness of at least one location of the plurality of locations using the average resistivity and the determined sheet resistance of the film at the location.

2. The method of claim 1, wherein determining the average thickness of a film deposited over a substrate comprises:
   depositing the film on the substrate;
   determining the mass of the film material deposited on the substrate;
   determining the film density of the film;
   determining the surface area over which the film is deposited; and
   calculating the average thickness using the mass of the film material, the film density, and the surface area.

3. The method of claim 2, wherein determining the mass of the film material deposited on the substrate comprises:
   taking a coulometer measurement during the deposition of the film on the substrate; and
   using the coulometer measurement to determine the mass of the film material.

4. The method of claim 1, wherein measuring at least one of the resistance and conductance of the film at a plurality of locations comprises:
   inducing an eddy current in the film deposited over the substrate at a first location;
   monitoring an electrical response modified by the induced eddy current to determine at least one of the resistance and conductance of the film at the first location; and
   repeating the acts of producing an eddy current and monitoring the electrical response for each of the plurality of locations.

5. The method of claim 4, wherein producing an eddy current in the film is performed at multiple excitation frequencies.

6. The method of claim 1, further comprising placing the substrate in contact with a thermal heat sink to control the temperature of the substrate.

7. The method of claim 1, wherein measuring at least one of the resistance and conductance of the film at a plurality of locations is controlled for temperature stability, controlling for temperature stability comprises:
   processing the substrate; and
   waiting a predetermined time for the substrate temperature to approach the ambient temperature before beginning to measure at least one of the resistance and conductance of the film.

8. The method of claim 1, wherein measuring at least one of the resistance and conductance of the film at a plurality of locations is controlled for temperature stability, controlling for temperature stability comprises:
   repeatedly measuring at least one of the resistance and conductance of the film at a first location until the difference between the last two measurements are below a threshold; and measuring at least one of the resistance and conductance of the film at the remaining locations.

9. The method of claim 1, wherein measuring at least one of the resistance and conductance of the film at a plurality of locations is controlled for temperature stability, controlling for temperature stability comprises:
  measuring the temperature of the substrate when measuring at least one of the resistance and conductance of the film at each location; and
  adjusting the measured resistance or conductance from each of the plurality of locations to be referenced to the same temperature.

10. The method of claim 1, wherein measuring at least one of the resistance and conductance of the film at a plurality of locations comprises measuring at least one of the total resistance and total conductance of the film and the substrate at a plurality of locations, the method further comprising:
  measuring at least one of the resistance and conductance of the substrate at the plurality of locations prior to depositing the film on the substrate;
  determining the resistance or conductance of the film using the measured at least one of the resistance and conductance of the substrate and the measured at least one of the total resistance and total conductance of the film.

* * * * *